United States Patent
Hashimoto et al.

(10) Patent No.: US 8,679,955 B2
(45) Date of Patent: Mar. 25, 2014

(54) METHOD FOR FORMING EPITAXIAL WAFER AND METHOD FOR FABRICATING SEMICONDUCTOR DEVICE

(75) Inventors: Shin Hashimoto, Itami (JP); Katsushi Akita, Itami (JP); Kensaku Motoki, Itami (JP); Hideaki Nakahata, Itami (JP); Shinsuke Fujiwara, Itami (JP)

(73) Assignees: Sumitomo Electric Industries, Ltd., Osaka-shi (JP); KOHA Co., Ltd., Tokyo (JP)

( * ) Notice: Subject to any disclaimer, the term of this patent is extended or adjusted under 35 U.S.C. 154(b) by 0 days.

(21) Appl. No.: 13/202,419

(22) PCT Filed: Feb. 10, 2010

(86) PCT No.: PCT/JP2010/051969
§ 371 (c)(1),
(2), (4) Date: Sep. 20, 2011

(87) PCT Pub. No.: WO2010/095550
PCT Pub. Date: Aug. 26, 2010

(65) Prior Publication Data
US 2012/0003770 A1    Jan. 5, 2012

(30) Foreign Application Priority Data
Feb. 19, 2009  (JP) ................ P2009-037121

(51) Int. Cl.
*H01L 21/20*     (2006.01)
(52) U.S. Cl.
USPC .......................................... 438/483; 438/46
(58) Field of Classification Search
USPC .................................................. 438/46, 483
See application file for complete search history.

(56) References Cited

U.S. PATENT DOCUMENTS

| | | | | |
|---|---|---|---|---|
| 2006/0223287 A1* | 10/2006 | Ushida et al. | ................ | 438/483 |
| 2007/0134833 A1 | 6/2007 | Ikemoto et al. | | |
| 2008/0237607 A1* | 10/2008 | Ichinose et al. | ................ | 257/76 |
| 2009/0197399 A1* | 8/2009 | Nakamura et al. | ............ | 438/503 |
| 2010/0244040 A1* | 9/2010 | Yokoyama et al. | ............. | 257/76 |
| 2010/0279020 A1* | 11/2010 | Melnik et al. | ............. | 427/419.7 |

FOREIGN PATENT DOCUMENTS

| JP | 2006-032739 A | 2/2006 |
|---|---|---|
| JP | 2006-135268 A | 5/2006 |

(Continued)

OTHER PUBLICATIONS

Shimamura et al., "Epitaxial Growth of GaN on (1 0 0)β-$Ga_2O_3$ Substrates by Metalorganic Vapor Phase Epitaxy," Japanese Journal of Applied Physics, vol. 44, No. 1, pp. L7-L8 (2005).

*Primary Examiner* — Zandra Smith
*Assistant Examiner* — Jaime C Niesz
(74) *Attorney, Agent, or Firm* — Venable LLP; Michael A. Sartori; Tamatane J. Aga

(57) ABSTRACT

A method for forming an epitaxial wafer is provided as one enabling growth of a gallium nitride based semiconductor with good crystal quality on a gallium oxide region. In step S107, an AlN buffer layer 13 is grown. In step S108, at a time t5, a source gas G1 containing hydrogen, trimethylaluminum, and ammonia, in addition to nitrogen, is supplied into a growth reactor 10 to grow the AlN buffer layer 13 on a primary surface 11a. The AlN buffer layer 13 is so called a low-temperature buffer layer. After a start of film formation of the buffer layer 13, in step S109 supply of hydrogen ($H_2$) is started at a time t6. At the time t6, $H_2$, $N_2$, TMA, and $NH_3$ are supplied into the growth reactor 10. A supply amount of hydrogen is increased between times t6 and t7, and at the time t7 the increase of hydrogen is terminated to supply a constant amount of hydrogen. At the time t7, $H_2$, TMA, and $NH_3$ are supplied into the growth reactor 10.

8 Claims, 10 Drawing Sheets

(56) References Cited

FOREIGN PATENT DOCUMENTS

| JP | 2006-310765 A | 11/2006 |
| JP | 2007-134463 A | 5/2007 |
| JP | 2008-016694 A | 1/2008 |
| JP | 2008-156141 A | 7/2008 |
| WO | WO 2008/056637 | * 5/2008 ............. H01L 33/00 |

* cited by examiner

Fig.2
(a)
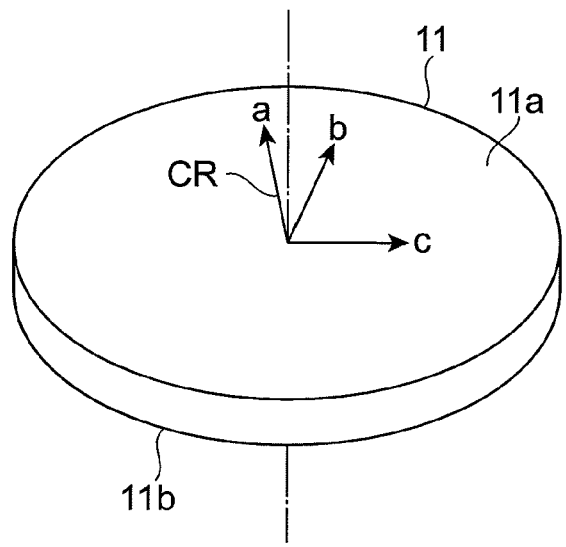
(b)
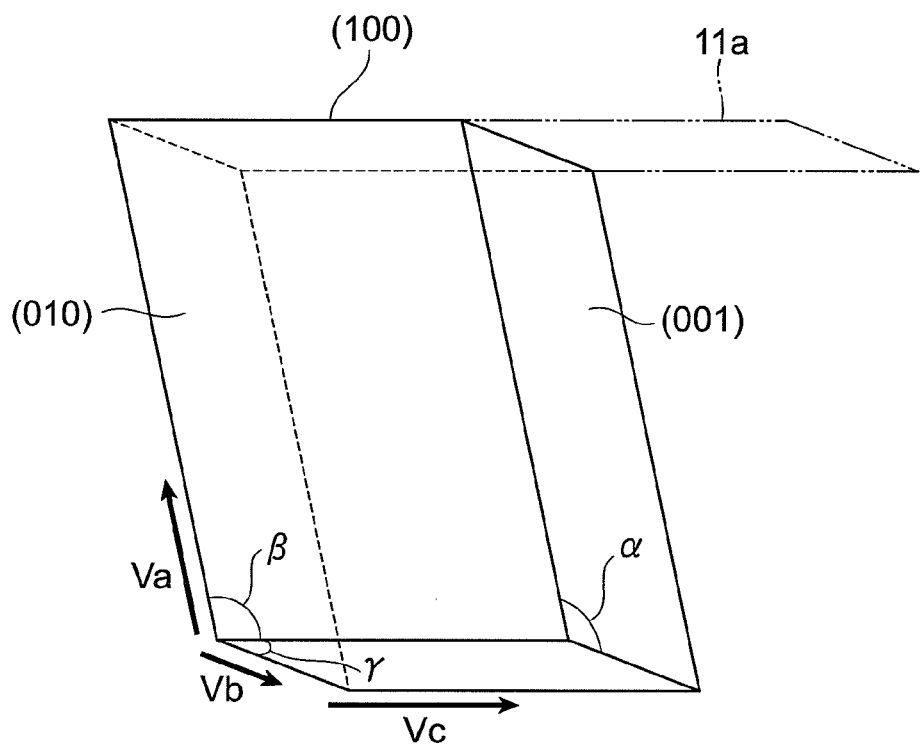

Fig.7

| Thickness of AlN film | Surface | XRD FWHM(arcsec) |
|---|---|---|
| 0.5 | epi-film delaminated across entire surface | — |
| 1 | flat surface with partial delamination of epi-film | 459 |
| 2 | flat surface (w/o delamination) | 381 |
| 3 | flat surface (w/o delamination) | 326 |
| 5 | flat surface (w/o delamination) | 288 |
| 10 | flat surface (w/o delamination) | 255 |
| 15 | flat surface (w/o delamination) | 360 |
| 20 | flat surface (w/o delamination) | 581 |
| 50 | flat surface (w/o delamination) | 950 |
| 100 | flat surface (w/o delamination) | 1845 |
| 150 | rough surface (w/o delamination) | (no c-plane obtained) |

*Fig.9*

| Growth temperature of AlN | Surface | XRD FWHM(arcsec) |
|---|---|---|
| 350 | epi-film with significant unevenness | 846 |
| 400 | flat surface (w/o delamination) | 567 |
| 450 | flat surface (w/o delamination) | 325 |
| 500 | flat surface (w/o delamination) | 255 |
| 550 | flat surface (w/o delamination) | 239 |
| 600 | flat surface (w/o delamination) | 220 |
| 650 | flat surface (w/o delamination) | 268 |
| 700 | flat surface (w/o delamination) | 329 |
| 750 | flat surface (w/o delamination) | 569 |
| 800 | flat surface (w/o delamination) | 1468 |
| 850 | rough surface (w/o delamination) | (no c-plane obtained) |

Fig.10
(a)
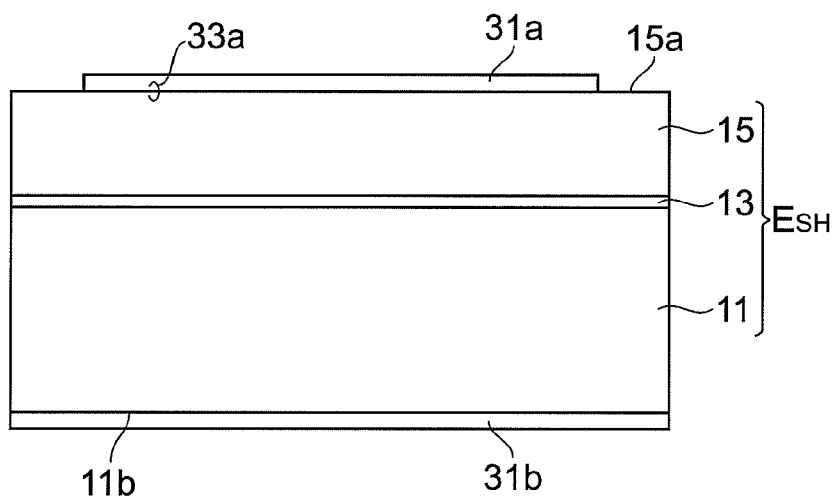
(b)
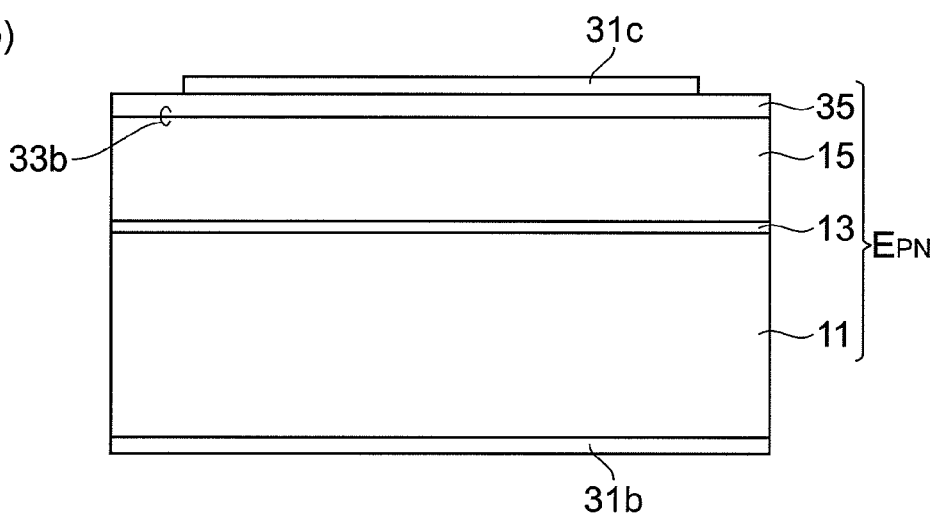

METHOD FOR FORMING EPITAXIAL WAFER AND METHOD FOR FABRICATING SEMICONDUCTOR DEVICE

TECHNICAL FIELD

The present invention relates to a method for forming an epitaxial wafer and a method for fabricating a semiconductor device.

BACKGROUND ART

Patent Literature 1 describes fabricate of a light emitting diode on a $Ga_2O_3$ substrate. The $Ga_2O_3$ substrate is subjected to a thermal treatment at 800 Celsius degrees with supply of nitrogen into a reactor and thereafter, the supply of nitrogen is terminated, while hydrogen is supplied into the reactor. At the temperature of 400 Celsius degrees, hydrogen, ammonia, and trimethylgallium are supplied to grow an AlN layer. After completion of film formation of the AlN layer, the supply of hydrogen is terminated and nitrogen is supplied into the reactor. In a nitrogen atmosphere, the temperature of the reactor is increased and at the temperature of 1050 Celsius degrees, a 1.0-μm GaN film is grown on the AlN layer. The supply of nitrogen is terminated, while hydrogen is supplied into the reactor to further grow a 2.0-μm GaN film.

Non Patent Literature 1 describes epitaxial growth of nitrides on a $\beta$-$Ga_2O_3$ single crystal substrate by the metal-organic vapor phase epitaxy process. An LT-GaN buffer layer is grown at 600 Celsius degrees on a (100) plane of the $Ga_2O_3$ single crystal substrate. The LT-GaN buffer layer is doped with Si. Subsequently, a GaN film of 1000 nm is grown at 1070 Celsius degrees.

CITATION LIST

Patent Literature

Patent Literature 1: Japanese Patent Application Laid-open No. 2006-310765

Non Patent Literature

Non Patent Literature 1: Jap. J. Appl. Phys. Vol. 44, No. 1, 2005, pp L7-L8

SUMMARY OF INVENTION

Technical Problem

In Non Patent Literature 1, the growth of the buffer layer on the $\beta$-$Ga_2O_3$ substrate is carried out under flow of hydrogen. In a hydrogen atmosphere at the temperature of not less than 600 Celsius degrees, the surface of the $\beta$-$Ga_2O_3$ substrate is modified to exhibit blackish appearance.

In Patent Literature 1, the LT-AlGaN buffer layer is grown under flow of hydrogen at the temperature of 400 Celsius degrees. The growth of the buffer layer is carried out in the range of 350 Celsius degrees to 550 Celsius degrees. When the film formation of the buffer layer is carried out in this temperature range, there occurs no modification of $\beta$-$Ga_2O_3$. On the other hand, growth of the buffer layer at higher temperatures can reduce incorporation of impurities into the buffer layer. Furthermore, growth of the buffer layer in a hydrogen atmosphere can also reduce incorporation of impurities into the buffer layer. Hence, the improvement in quality of the buffer layer is effective in improvement in quality of crystals grown thereon.

It is an object of the present invention to provide a method for forming an epitaxial wafer, which enables growth of a gallium nitride based semiconductor with excellent crystal quality on a gallium oxide region, and it is another object of the present invention to provide a method for fabricating a semiconductor device, which enables growth of a gallium nitride based semiconductor with excellent crystal quality on a gallium oxide region.

Solution To Problem

One aspect of the present invention is a method for forming an epitaxial wafer. This method comprises the steps of: (a) placing a gallium oxide substrate in a growth reactor; (b) changing a substrate temperature of the gallium oxide substrate, while supplying nitrogen into the growth reactor so as to expose the gallium oxide substrate to a nitrogen atmosphere; (c) after the substrate temperature reaches a first film formation temperature, forming a buffer layer of $Al_xGa_{1-x}N$ ($0<X\le1$) at the first film formation temperature, while supplying nitrogen into the growth reactor; and (d) growing a gallium nitride based semiconductor layer on the buffer layer at a second film formation temperature in the growth reactor. The first film formation temperature is not less than 550 Celsius degrees and supply of hydrogen into the growth reactor is started during growth of the buffer layer.

This method comprises starting the supply of hydrogen after the start of growth of the buffer layer and without supplying hydrogen into the growth reactor before the start of the growth of the buffer layer, and this process prevents the gallium oxide substrate from being exposed directly to a hydrogen-containing atmosphere. Since the growth reactor is kept in a nitrogen atmosphere at the start of the growth and in the initial stage of growth of the buffer layer, the film formation of the buffer layer can be carried out at the temperature of not less than 550 Celsius degrees. Starting the supply of hydrogen into the growth reactor in the middle of the growth of the buffer layer can improve the quality of the buffer layer.

The method according to the present invention can be configured as follows: a thickness of the buffer layer is not less than 2 nm.

This method allows the growth of the buffer layer with excellent quality because the thickness is not less than 2 nm, and it also improves the quality of the gallium nitride based semiconductor layer grown on this buffer layer.

The method according to the present invention can be configured as follows: the supply of nitrogen into the growth reactor is terminated during film formation of the buffer layer.

This method reduces mixture of impurities into the buffer layer because of use of hydrogen.

The method according to the present invention can be configured as follows: a nitrogen raw material for growth of the buffer layer contains $NH_3$, and a Group III raw material for growth of the buffer layer contains a metal-organic compound.

This method allows the growth of the buffer layer using the same raw materials as those for the gallium nitride based semiconductor grown thereon.

The method according to the present invention can be configured as follows: the thickness of the buffer layer can be not more than 100 nm.

This method prevents the gallium nitride based semiconductor from peeling.

In the method according to the present invention, a maximum temperature in the step of changing a substrate temperature of the gallium oxide substrate is not less than 550 Celsius degrees and not more than the first film formation temperature. The step of changing a substrate temperature of the gallium oxide substrate includes: changing the substrate temperature to a pretreatment temperature of not more than the first film formation temperature in a nitrogen atmosphere; and after the substrate temperature reaches the pretreatment temperature, placing the gallium oxide substrate in the nitrogen atmosphere for a predetermined duration, while keeping the substrate temperature at a temperature of not less than 550 Celsius degrees. In this method, the pretreatment prior to the film formation of the buffer layer can improve the quality of the buffer layer.

In the method according to the present invention, the step of changing a substrate temperature of the gallium oxide substrate includes: changing the substrate temperature to a pretreatment temperature of not less than 750 Celsius degrees in a nitrogen atmosphere; after the substrate temperature reaches the pretreatment temperature, placing the gallium oxide substrate in the nitrogen atmosphere for a predetermined duration, while keeping the substrate temperature at a temperature of not less than 750 Celsius; and after a lapse of the predetermined duration, changing the substrate temperature to the first film formation temperature. The first film formation temperature is lower than 750 Celsius degrees.

In this method, the pretreatment prior to the film formation of the buffer layer can be carried out at the temperature higher than the film formation temperature of the buffer layer. The pretreatment at the temperature of not less than 750 Celsius degrees can nitride the surface of the gallium oxide substrate.

The method according to the present invention can be configured as follows: the pretreatment temperature is less than 850 Celsius degrees. In this method, a too high pretreatment temperature might damage the surface of the gallium oxide substrate.

The method according to the present invention can be configured as follows: a primary surface of the gallium oxide substrate has a plane orientation of a (100) plane. In this method, a gallium nitride based semiconductor grown on the gallium oxide substrate has a surface which is substantially a c-plane.

The method according to the present invention can be configured as follows: the buffer layer is comprised of $Al_xGa_{1-x}N$ ($0.5 \leq X < 1$). Alternatively, the method according to the present invention can be configured as follows: the buffer layer is comprised of AlN.

Another aspect of the present invention is a method for fabricating a semiconductor device. This method comprises the steps of (a) placing a gallium oxide substrate in a growth reactor; (b) after the gallium oxide substrate is placed in the growth reactor, changing a substrate temperature of the gallium oxide substrate, while supplying nitrogen into the growth reactor so as to expose the gallium oxide substrate to a nitrogen atmosphere; (c) after the substrate temperature reaches a buffer film formation temperature, forming a buffer layer of $Al_xGa_{1-x}N$ ($0 < X \leq 1$) at the buffer film formation temperature, while supplying nitrogen into the growth reactor; and (d) forming a gallium nitride based semiconductor region on the buffer layer in the growth reactor. Supply of hydrogen into the growth reactor is started in the middle of the growth of the buffer layer.

Since this method comprises starting the supply of hydrogen in the middle of the growth of the buffer layer and without supplying hydrogen into the growth reactor before a start of the growth of the buffer layer, this process can prevent the gallium oxide substrate from being exposed directly to a hydrogen-containing atmosphere. Since the growth reactor is kept in the nitrogen atmosphere at the start of the growth and in the initial stage of growth of the buffer layer, the film formation of the buffer layer can be carried out at the temperature of not less than 550 Celsius degrees. Starting the supply of hydrogen into the growth reactor during the growth of the buffer layer can improve the quality of the buffer layer. Therefore, the gallium nitride based semiconductor region suitable for the semiconductor device can be produced on the buffer layer.

The method according to the present invention can be configured as follows: a thickness of the buffer layer is not less than 2 nm. This method allows the buffer layer to grow with excellent quality because of the thickness of not less than 2 nm, and the gallium nitride based semiconductor layer grown on the buffer layer has an improved quality.

The method according to the present invention can be configured as follows: the supply of nitrogen into the growth reactor is terminated before the termination of film formation of the buffer layer. This method reduces incorporation of impurities into the buffer layer because of the use of hydrogen and the gallium nitride based semiconductor layer grown on the buffer layer also has an improved quality.

The method according to the present invention can be configured as follows: the thickness of the buffer layer can be not more than 100 nm.

In the method according to the present invention, the gallium nitride based semiconductor region includes a first conductivity type gallium nitride based semiconductor layer, a second conductivity type gallium nitride based semiconductor layer, and an active layer; the first conductivity type gallium nitride based semiconductor layer, the active layer, and the second conductivity type gallium nitride based semiconductor layer are arranged in order on a primary surface of the buffer layer; the active layer is provided between the first conductivity type gallium nitride based semiconductor layer and the second conductivity type gallium nitride based semiconductor layer. The semiconductor device can include a semiconductor light emitting device. This method can provide the semiconductor light emitting device produced on the gallium oxide substrate.

The method according to the present invention can further comprise the step of forming a first electrode on the gallium nitride based semiconductor region and forming a second electrode on a back surface of the gallium oxide substrate. The gallium oxide substrate has conductivity. In this method, the semiconductor device has a vertical type structure.

In the method according to the present invention, the gallium nitride based semiconductor region includes a first conductivity type gallium nitride based semiconductor layer and a second conductivity type gallium nitride based semiconductor layer; the first conductivity type gallium nitride based semiconductor layer makes a pn junction with the second conductivity type gallium nitride based semiconductor layer. The method can further comprise the step of forming a first electrode on the second conductivity type gallium nitride based semiconductor layer and forming a second electrode on a back surface of the gallium oxide substrate. The gallium oxide substrate has conductivity, and the semiconductor device includes a pn junction diode. This method can provide the pn junction diode produced on the gallium oxide substrate.

In the method according to the present invention, the gallium nitride based semiconductor region includes a first conductivity type gallium nitride based semiconductor layer. The method can further comprise the step of forming a first electrode on the first conductivity type gallium nitride based semiconductor layer and forming a second electrode on a back surface of the gallium oxide substrate. The first electrode makes a Schottky junction with the first conductivity type gallium nitride based semiconductor layer, the gallium oxide substrate has conductivity, and the semiconductor device includes a Schottky diode. This method can provide the Schottky diode produced on the gallium oxide substrate.

The method according to the present invention can be configured as follows: a carrier concentration of the first conductivity type gallium nitride based semiconductor layer is not more than $3 \times 10^{16}$ cm$^{-3}$.

This method can provide the pn junction diode and Schottky diode applicable as power devices produced on the gallium oxide substrate.

The above objects and other objects, features, and advantages of the present invention will more readily become clear from the following detailed description of the preferred embodiments of the present invention with reference to the accompanying drawings.

Advantageous Effects of Invention

As described above, one aspect of the present invention provides the method for forming the epitaxial wafer, which enables growth of the gallium nitride based semiconductor with excellent crystal quality on the gallium oxide region. Another aspect of the present invention provides the method for fabricating a semiconductor device, which enables growth of the gallium nitride based semiconductor with excellent crystal quality on the gallium oxide region.

BRIEF DESCRIPTION OF DRAWINGS

FIG. 2 is a drawing showing a gallium oxide substrate.

FIG. 7 is a drawing showing surfaces (delamination, flatness) and crystal qualities (full widths at half maximum of XRD) of high-temperature GaN epitaxial films 3 μm thick grown on these AlN films.

FIG. 9 is a drawing showing surfaces (delamination, flatness) and crystal qualities (full widths at half maximum of XRD) of high-temperature GaN epitaxial films 3 μm thick grown on these AlN films.

FIG. 10 is a drawing showing structures of epitaxial wafers and substrate products for a Schottky diode and a pn junction diode.

DESCRIPTION OF EMBODIMENTS

The expertise of the present invention can be readily understood in view of the following detailed description with reference to the accompanying drawings provided by way of examples. The below will describe embodiments of the method for forming the epitaxial wafer and the method for fabricating the semiconductor device according to the present invention, with reference to the accompanying drawings. The same portions will be denoted by the same reference signs as much as possible.

Figure 1:
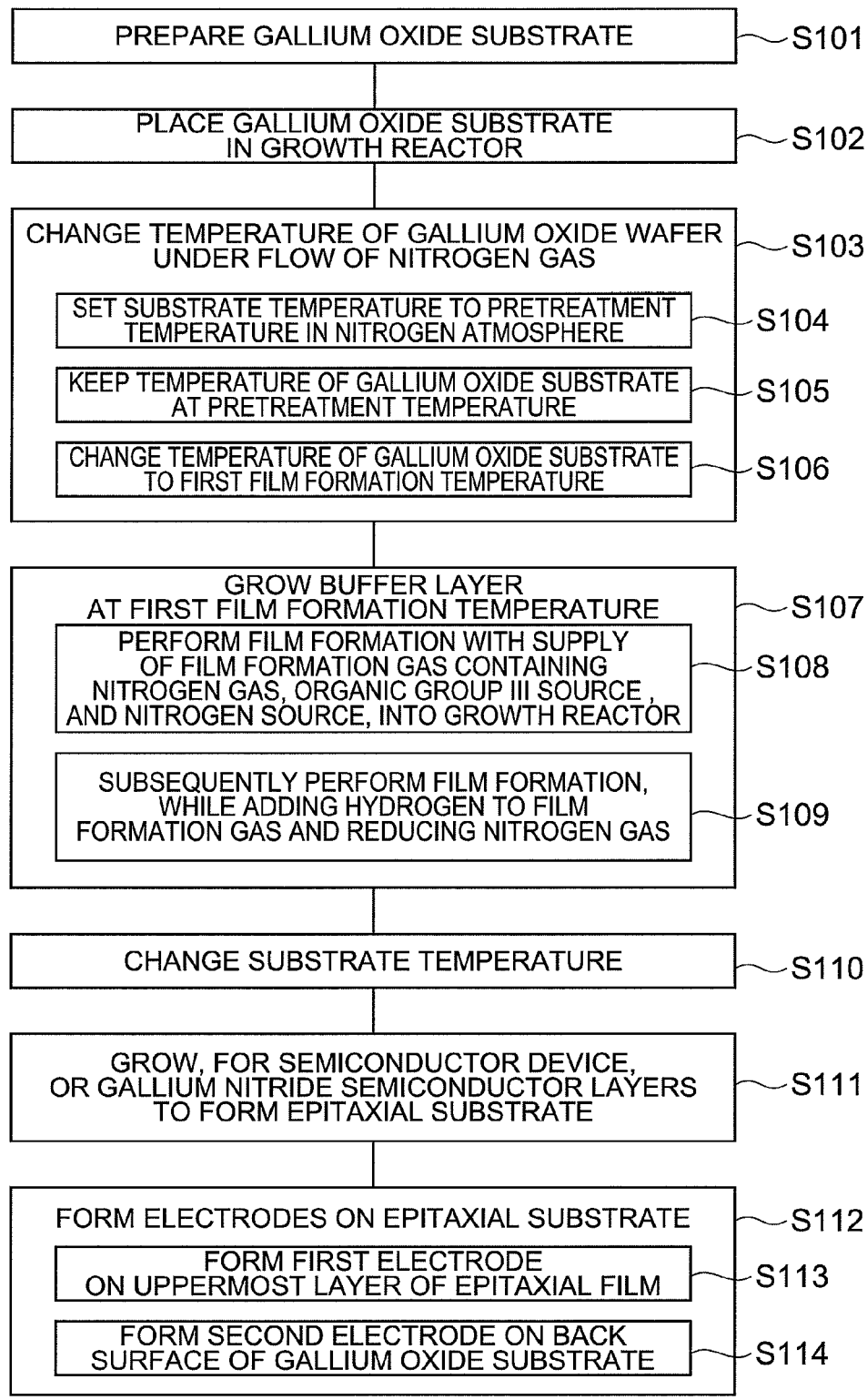
FIG. 1 is a drawing showing major steps of a method for forming an epitaxial wafer and a method for fabricating a semiconductor device according to an embodiment of the present invention.
Figure 3:
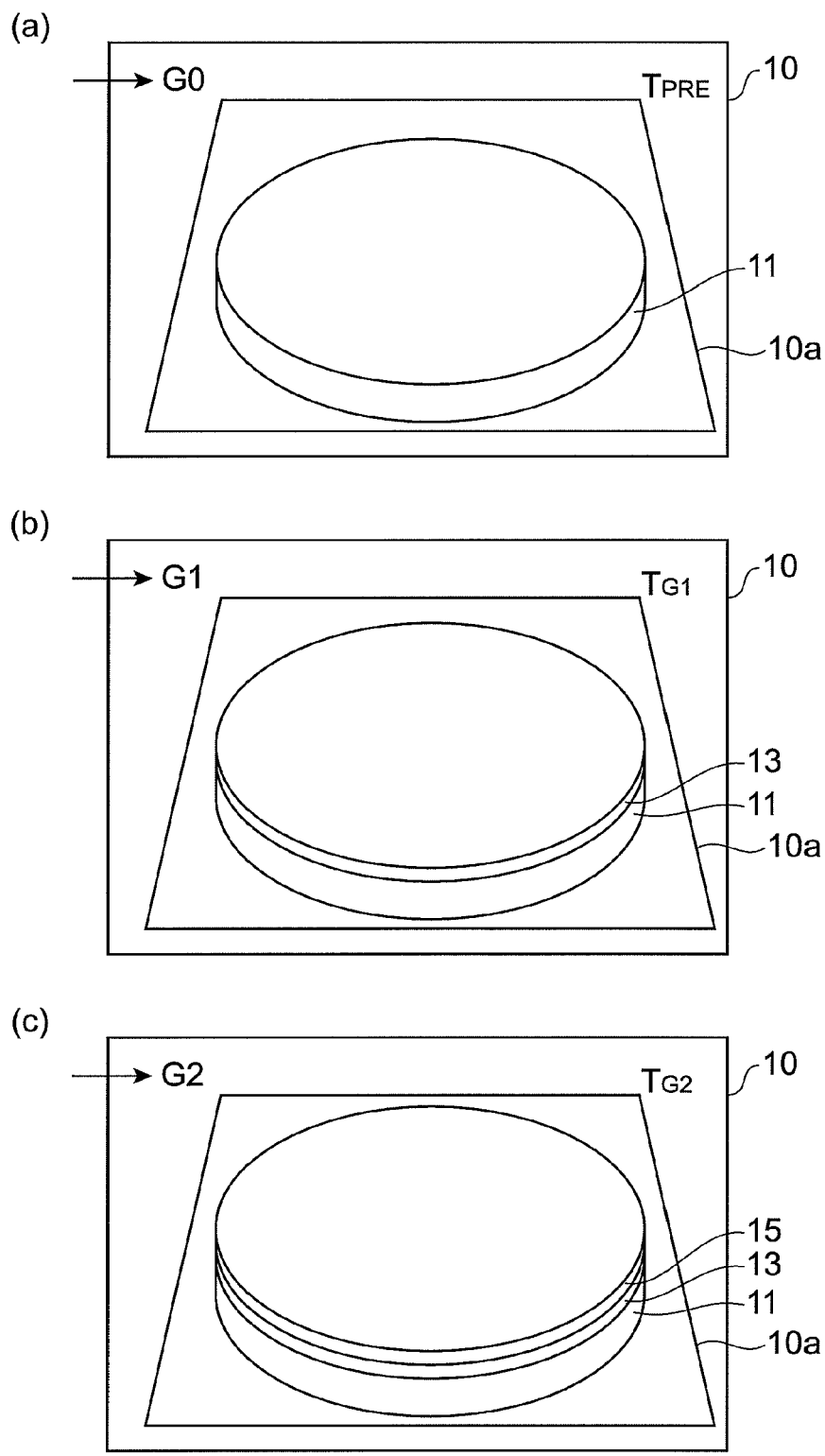
FIG. 3 is a drawing schematically showing major steps of the forming method and the fabricating method according to the embodiment.

FIG. 1 is a drawing showing major steps of a method for forming an epitaxial wafer and a method for fabricating a semiconductor device according to an embodiment of the present invention. FIG. 2 is a drawing showing a gallium oxide substrate for the epitaxial wafer according to the present embodiment. FIG. 3 is a drawing schematically showing major steps of the forming method and the fabricating method according to the present embodiment.

In the step flow shown in FIG. 1, step S101 is to prepare a gallium oxide wafer. Referring to FIG. 2 (a), a gallium oxide wafer 11 is shown therein. This wafer 11 comprises, for example, a β-Ga$_2$O$_3$ single crystal. The wafer 11 includes a primary surface 11a and a back surface 11b, and the primary surface is made of monoclinic gallium oxide, and the primary surface 11a and the back surface 11b can be parallel to each other. The primary surface 11a of the wafer 11 is, for example, a (100) plane of monoclinic gallium oxide. This primary surface 11a can be inclined, for example, at an angle of not more than 1 degrees relative to the (100) plane. A crystal coordinate system CR is shown in FIG. 2 (a) and the crystal coordinate system CR has the a-axis, b-axis, and c-axis.

With reference to FIG. 2 (b), the crystal lattice of monoclinic gallium oxide is shown therein. The lattice constants of the a-axis, b-axis, and c-axis of the crystal lattice of monoclinic gallium oxide are 1.223 nm, 0.304 nm, and 0.58 nm, respectively. Vectors Va, Vb, and Vc represent directions of the a-axis, b-axis, and c-axis, respectively. The vectors Va and Vb define the (001) plane, the vectors Vb, Vc the (100) plane, and the vectors Vc and Va the (010) plane. The angle α made by the vectors Va and Vb and the angle γ made by the vectors Vb and Vc are 90° and the angle β made by the vectors Vc and Va is 103.7°. For showing the inclination angle $A_{OFF}$ of the wafer primary surface 11a, the wafer primary surface 11a is indicated by a chain line in FIG. 2 (b). This wafer 11 enables an epitaxial layer with an excellent morphology to grow on the wafer primary surface 11a of the (100) plane of monoclinic gallium oxide.

In step S102, the wafer 11 is placed on a susceptor 10a in a growth reactor 10. Growth of Group III nitride films is carried out, for example, by the metal-organic vapor phase epitaxy (MOVPE) process or the like. Next, as shown in FIG. 3 (a), while a gas G0 is supplied into the growth reactor 10, the temperature of the gallium oxide substrate 11 in the growth reactor 10 is changed. The gas G0 contains, for example, nitrogen gas, substantially containing no hydrogen. Since the gallium oxide substrate 11 is protected in contact with nitrogen supplied into the growth reactor 10, the supply of nitrogen prevents the gallium oxide substrate 11 from being affected by hydrogen. For this reason, the substrate temperature in the nitrogen atmosphere can be set higher than that in the growth of supplying hydrogen into the growth reactor 10. In the nitrogen atmosphere, the substrate temperature for the gallium oxide substrate 11 can be not more than 800 Celsius degrees.

The temperature change of the gallium oxide substrate 11 can be carried out, for example, according to either of the two sequences described below. The first and second sequences will be described with reference to FIG. 4.

In the first sequence SEQ1, at a time t0, a rise of substrate temperature of the gallium oxide substrate 11 starts toward a pretreatment temperature $T_{PRE}$ (the pretreatment temperature $T_{PRE}$ is the same as a first film formation temperature $T_{G1}$) for subsequent growth of a buffer layer. At a time t1, the substrate temperature reaches the pretreatment temperature $T_{PRE}$. In the sequence SEQ1, a maximum temperature of substrate temperature of the gallium oxide substrate 11 is not less than 550 Celsius degrees and is not more than a maximum of the first film formation temperature $T_{G1}$. After the substrate temperature of the gallium oxide substrate 11 reaches the pretreatment temperature $T_{PRE}$, the gallium oxide substrate 11 is placed in a nitrogen atmosphere for a predetermined duration, while the substrate temperature of the gallium oxide substrate 11 is maintained at the temperature of not less than 550 Celsius degrees. The pretreatment prior to the film formation of the buffer layer 13 can improve the quality of the buffer layer 13.

In the second sequence SEQ2, the gallium oxide substrate 11 is placed in the nitrogen atmosphere at the pretreatment temperature $T_{PRE}$ higher than the first film formation temperature $T_{G1}$. After this treatment, the temperature of the gallium oxide substrate 11 is changed to the first film formation temperature $T_{G1}$ for subsequent growth of the buffer layer. Specifically, in step S104 a rise of the substrate temperature of the gallium oxide substrate 11 is started at the time t0. In step S105 the substrate temperature reaches the pretreatment temperature $T_{PRE0}$ at the time t1, and this temperature is kept thereat. The pretreatment temperature $T_{PRE0}$ is, for example, in the range of not less than 750 Celsius degrees. The pretreatment prior to the film formation of the buffer layer 13 can be performed at the temperature higher than the film formation temperature of the buffer layer 13. The pretreatment temperature $T_{PRE0}$ of not less than 750 Celsius degrees can nitride the surface 11a of the gallium oxide substrate 11. The pretreatment temperature $T_{PRE0}$ is, for example, in the range of less than 850 Celsius degrees. A too high pretreatment temperature might damage the surface 11a of the gallium oxide substrate 11.

Placing the gallium oxide substrate 11 in the nitrogen atmosphere at the pretreatment temperature $T_{PRE}$ causes the primary surface of the gallium oxide substrate 11 to modify. This surface modification causes, for example, nitrogen to bind to the primary surface 11a or causes the primary surface 11a to be nitrided depending upon the substrate temperature. In step S106 decrease of substrate temperature is started at a time t3. At a time t4, the substrate temperature changed reaches the first film formation temperature $T_{G1}$.

Figure 4:
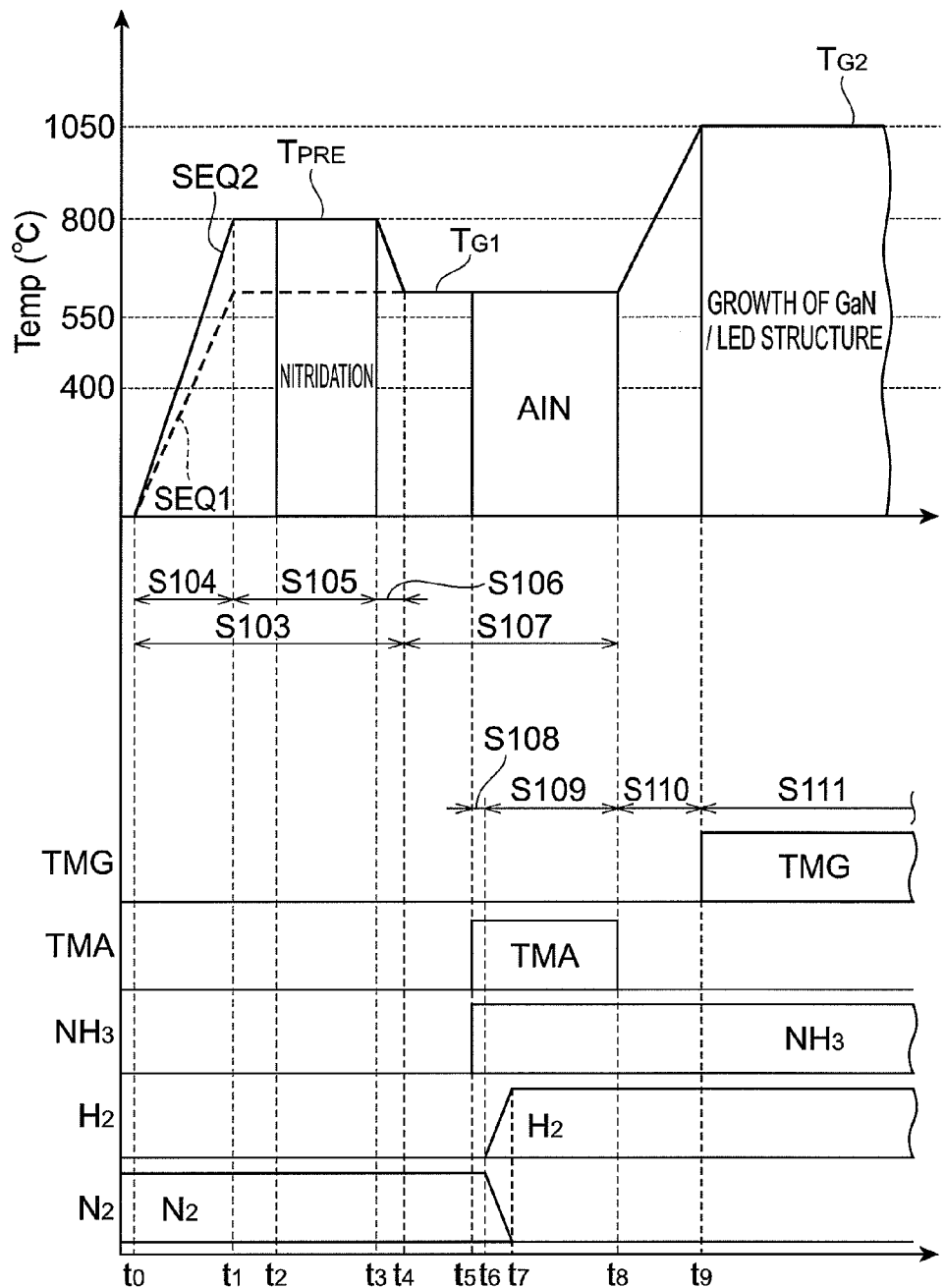
FIG. 4 is a drawing to explain first and second sequences for temperature change prior to growth of a buffer layer.

In the example shown in FIG. 4, the pretreatment temperature $T_{PRE0}$ is set at 800 Celsius degrees. At the time t2(>t1), the primary surface 11a is nitrided through the surface modification. At the time t3, the substrate temperature is changed from the pretreatment temperature $T_{PRE0}$. According to this procedure, the gallium oxide substrate 11 is placed in the nitrogen atmosphere during the duration from the time t1 to the time t3. At the time t3, the substrate temperature is decreased toward the first film formation temperature $T_{G1}$ in the present example. At the time t4, the substrate temperature reaches the first film formation temperature $T_{G1}$.

In step S107, after the temperature of the gallium oxide substrate 11 is kept fully stably at the first film formation temperature $T_{G1}$, a film formation gas G1 is supplied into the growth reactor 1 as shown in FIG. 3 (b), to grow the buffer layer 13. In step S108, at a time t5, a metal-organic compound raw material and a nitrogen raw material, in addition to nitrogen ($N_2$), are supplied into the growth reactor 10 to start growth of the buffer layer 13 on the primary surface 11a. The buffer layer 13 is made, for example, of a Group III nitride such as AlN or AlGaN. The buffer layer 13 is so called a low-temperature buffer layer. When the buffer layer 13 is made of AlN, a source gas G1 containing $N_2$, trimethylaluminum (TMA), and ammonia ($NH_3$) is supplied into the growth reactor 10. In another example where the buffer layer 13 is made of AlGaN, a source gas G1 containing $N_2$, trimethylgallium (TMG), trimethylaluminum (TMA), and ammonia ($NH_3$) is supplied into the growth reactor 10.

After the start of film formation of the buffer layer 13, step S109 is carried out to start supply of hydrogen ($H_2$) in addition to the metal-organic compound raw material and the nitrogen raw material. In the present embodiment the supply of hydrogen ($H_2$) is started at a time t6. When the buffer layer 13 is made of AlN, $H_2$, $N_2$, TMA, and $NH_3$ are supplied into the growth reactor 10 at the time t6. This method reduces incorporation of impurities into the buffer layer 13 because of the use of hydrogen. If necessary, after a start of the supply of hydrogen ($H_2$), a supply amount of nitrogen can be reduced, and the supply of nitrogen is preferably stopped during the growth of the buffer layer 13. In the present example, the supply amount of nitrogen is reduced between the times t6 and t7 and the supply of nitrogen is terminated at the time t7. Furthermore, a supply amount of hydrogen is increased between the times t6 and t7, and the increase of hydrogen is terminated at the time t7 so as to supply a constant amount of hydrogen. At the time t7, $H_2$, TMA, and $NH_3$ are supplied into the growth reactor 10. For this reason, the duration between the times t6 and t7 is used as a gas changeover duration. During the duration between the times t7 and t8, $H_2$, TMA, and $NH_3$ are supplied into the growth reactor 10 to grow the rest of buffer layer 13.

Since this method includes: supplying no hydrogen into the growth reactor 10 before the start of the growth of the buffer layer 13; and starting the supply of hydrogen after the start of the growth of the buffer layer and prior to the terminate of the growth of the buffer layer, this sequence can prevent the gallium oxide substrate 11 from being subject directly to the hydrogen-containing atmosphere. Since the growth reactor 10 is kept in the nitrogen atmosphere at the growth starting point and in the initial stage of growth of the buffer layer 13, the film formation of the buffer layer 13 can be performed at the temperature of not less than 550 Celsius degrees. Since the supply of hydrogen into the growth reactor 10 is started during the growth of buffer layer 13, the quality of the buffer layer 13 is improved. The growth temperature T1 of the buffer layer 13 can be, for example, not more than 800 Celsius degrees, which is used for preventing reaction between the buffer layer and the substrate or for preventing damage to the substrate during the film formation of the buffer layer.

The thickness of the buffer layer 13 can be not less than 2 nm. The buffer layer 13 can be grown in the thickness of not less than 2 nm and with excellent quality, and the quality of a gallium nitride based semiconductor layer grown on this buffer layer 13 also becomes excellent. The thickness of the buffer layer 13 can be not more than 100 nm. This thickness prevents occurrence of delamination of the gallium nitride based semiconductor.

In step S110, the supply of TMA is terminated to complete the film formation of the buffer layer 13, and a change of substrate temperature of the gallium oxide substrate 11 is started. At a time t8, the change of substrate temperature is started. During this temperature change, $H_2$ and $NH_3$ are supplied into the growth reactor 10. At a time t9 the temperature reaches a second film formation temperature $T_{G2}$. A gas to be supplied into the growth reactor 10 in step S110 is preferably ammonia and hydrogen. This method eliminates the step of carrier gas changeover because the supply of hydrogen is already started during the film formation of the buffer layer 13. The gas to be supplied into the growth reactor 10 in step S110 can be mixed gas of hydrogen and nitrogen, or mixed gas of ammonia and nitrogen.

In step S111, after completion of the temperature change, a hexagonal gallium nitride based semiconductor epitaxial layer (which will be referred to hereinafter as "epitaxial layer") 15 is grown on the buffer layer 13 in the growth reactor 10. At the time t9, as shown in FIG. 3 (c), a source material G2 containing an organic Group III source gas for a Group III constituent of the epitaxial layer 15 to be grown, in addition to $H_2$ and $NH_3$, is supplied into the growth reactor 10. This film formation is carried out at the second film formation temperature $T_{G2}$. In the present example, the organic Group III source gas G2 such as TMG is supplied to grow the epitaxial layer 15, such as gallium nitride, on the buffer layer 13.

The epitaxial layer 15 comprises, for example, a hexagonal Group III nitride such as GaN, AlGaN, InGaN, or AlN. The thickness of the epitaxial layer 15 can be, for example, in the range of not less than 1 micrometer. The thickness of the epitaxial layer 15 can be in the range of not more than 20 micrometers. When the epitaxial layer 15 is made of GaN, a source gas G1 containing trimethylgallium (TMG) and ammonia ($NH_3$) is supplied into the growth reactor 10. The growth temperature of GaN can be, for example, not less than 900 Celsius degrees and not more than 1200 Celsius degrees. The growth temperature of AlGaN can be, for example, not less than 900 Celsius degrees and not more than 1300 Celsius degrees. The growth temperature of InGaN can be, for example, not less than 500 Celsius degrees and not more than 1000 Celsius degrees.

The epitaxial layer 15 is one of semiconductor layers forming a gallium nitride semiconductor device, which can be undoped, or doped with a p-type dopant or with an n-type dopant. For imparting p-conductivity or n-conductivity to the epitaxial layer 15, a dopant gas is supplied in addition to the source gas during the growth of the epitaxial layer 15. The dopant to be used is cyclopentadienyl magnesium ($Cp_2Mg$) for the p-type conductivity or silane (e.g., $SiH_4$) for the n-type conductivity.

When the primary surface 11a of the gallium oxide substrate 11 is substantially a (100) plane, this method provides the gallium nitride based semiconductor grown on the gallium oxide substrate 11 with a surface which is substantially a c-plane.

Figure 5:
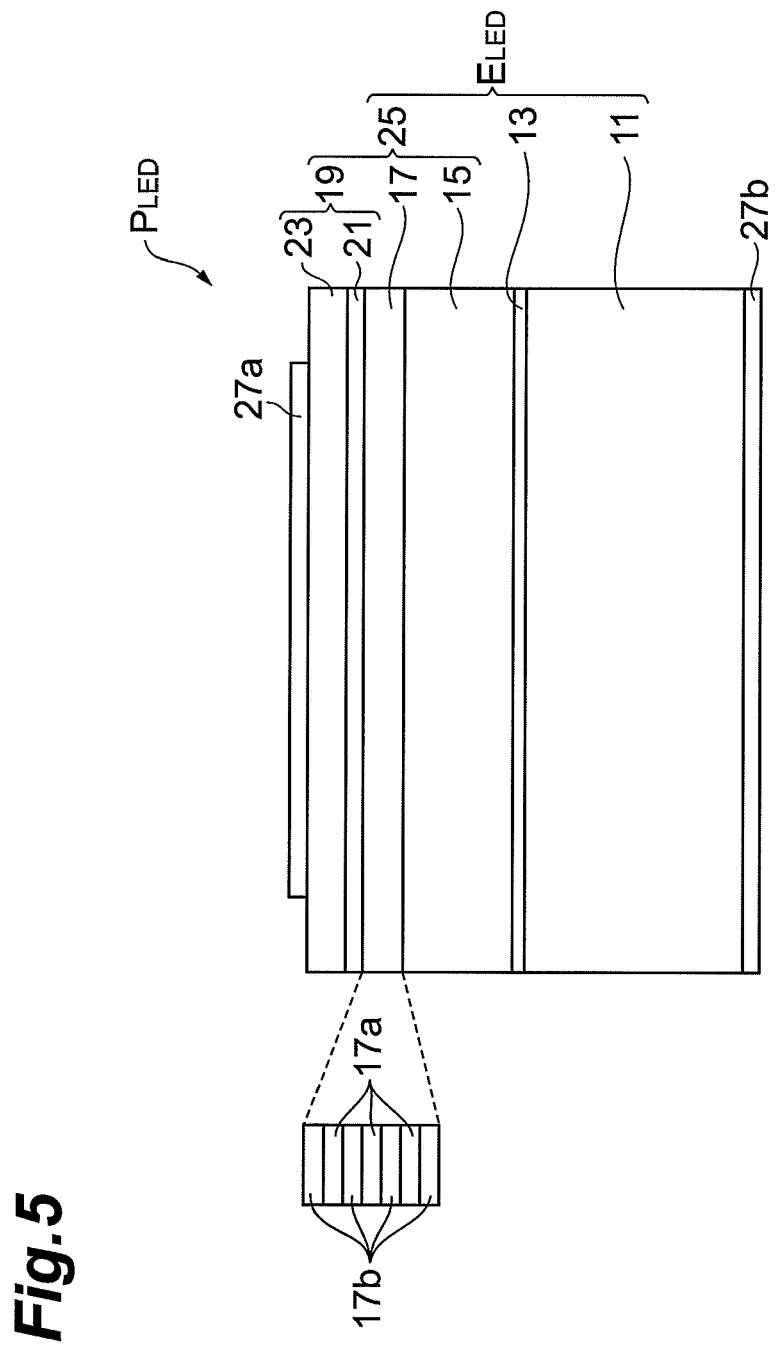
FIG. 5 is a drawing showing major steps to fabricate a semiconductor light emitting device as a semiconductor device on a gallium oxide substrate 11.

With reference to FIG. 5, the below will describe major steps for fabricating a semiconductor device on the gallium oxide substrate 11. When the semiconductor device produced on the gallium oxide substrate 11 is a semiconductor light emitting device, the epitaxial layer 15 has a first conductivity type. This first conductivity type epitaxial layer comprises, for example, a hexagonal Group III nitride such as n-type GaN, n-type AlGaN, or n-type InAlGaN. When the first conductivity type epitaxial layer is made of GaN, a source gas containing $H_2$, TMG, $NH_3$, and $SiH_4$ is supplied into the growth reactor 10 to grow an n-type GaN film. When the first conductivity type epitaxial layer is made of GaN, the growth temperature of the first conductivity type epitaxial layer is, for example, in the range of not less than 900 Celsius degrees and not more than 1200 Celsius degrees, and the first conductivity type epitaxial layer is one of semiconductor layers constituting a gallium nitride based semiconductor device.

Next, an active layer 17 is formed on the first conductivity type epitaxial layer. The active layer includes well layers 17a and barrier layers 17b, which are arranged alternately. The well layers 17a comprise, for example, GaN, InGaN, InAlGaN, or the like. The barrier layers 17b comprise, for example, GaN, InGaN, InAlGaN, or the like. The growth temperature of the well layers 17a is, for example, in the range of not less than 500 Celsius degrees and not more than 900 Celsius degrees and the growth temperature of the barrier layers 17b, for example, in the range of not less than 550 Celsius degrees and not more than 950 Celsius degrees.

Thereafter, a second conductivity type epitaxial layer 19 is formed on the active layer 17. The second conductivity type epitaxial layer 19 can include, for example, a p-type electron block layer 21 and a p-type contact layer 23. When the second conductivity type epitaxial layer 19 comprises GaN or AlGaN, the growth temperature of the second conductivity type epitaxial layer is, for example, 1000 Celsius degrees, and the second conductivity type epitaxial layer 19 is one of semiconductor layers constituting a gallium nitride based semiconductor device.

The growth of gallium nitride based semiconductors up to the above steps results in obtaining an epitaxial wafer $E_{LED}$. The epitaxial wafer $E_{LED}$ includes the gallium oxide wafer 11, and the buffer layer 13 and semiconductor lamination 25 grown on the gallium oxide wafer 11. This semiconductor lamination 25 includes the first conductivity type epitaxial layer 15, the second conductivity type epitaxial layer 19 and the active layer 17, and the active layer 17 is provided between the first conductivity type epitaxial layer 15 and the second conductivity type epitaxial layer 19.

Referring again to FIG. 1, next, in step S112 first and second electrodes 27a, 27b are formed on the epitaxial wafer $E_{LED}$. For example, in step S113 the first electrode 27a is formed on a top surface of the semiconductor lamination 25 of the epitaxial wafer $E_{LED}$ and in step S114, the second electrode 27b is formed on the back surface of the epitaxial wafer $E_{LED}$. These steps result in producing a substrate product $P_{LED}$ for a gallium nitride based semiconductor light emitting device. This method allows the fabrication of the semiconductor light emitting device, the substrate product $P_{LED}$ for it, and the epitaxial wafer $E_{LED}$ for it, on the gallium oxide substrate 11.

Figure 6:
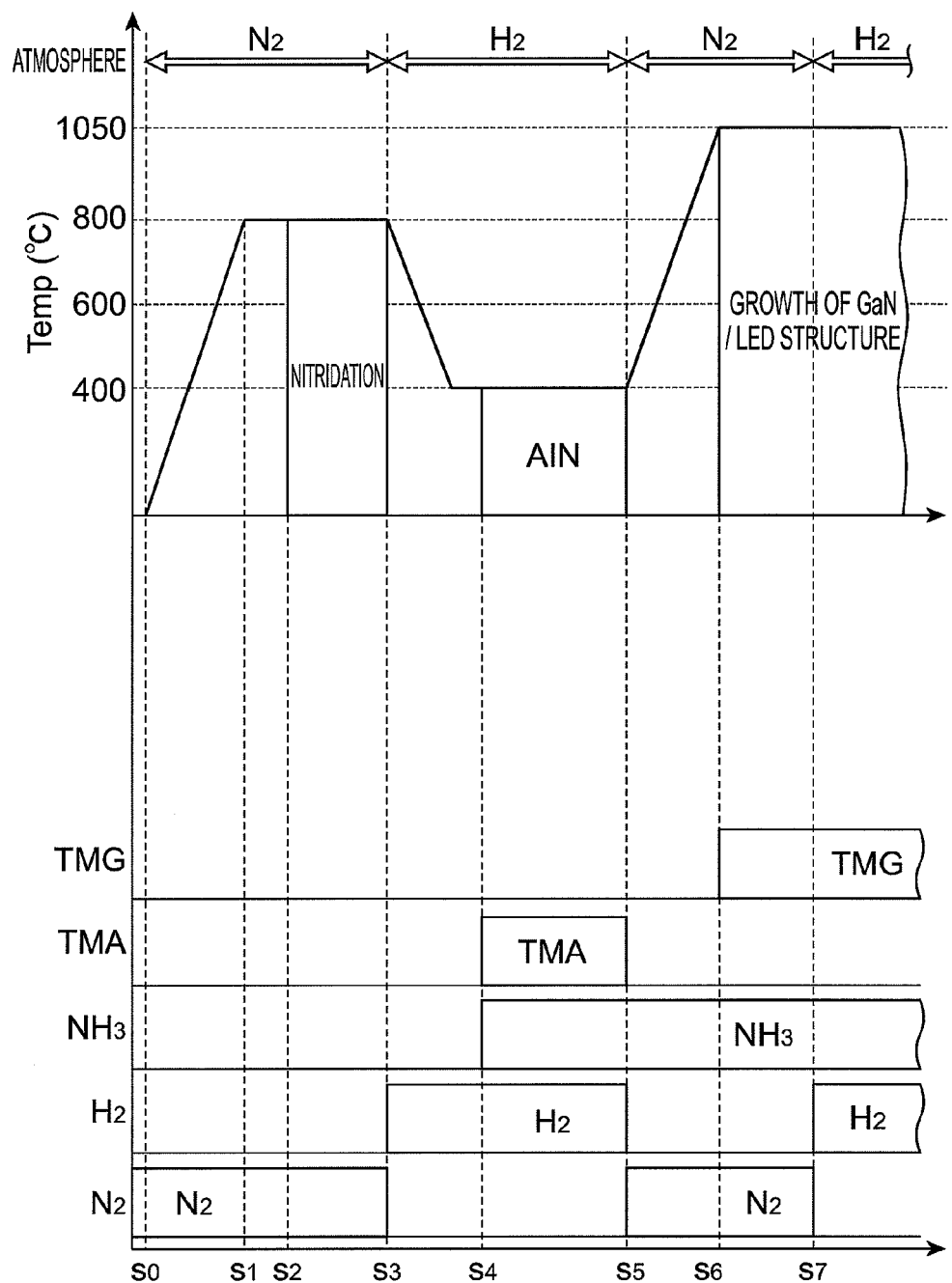
FIG. 6 is a drawing showing a fabricating method including carrying out changeover of carrier gas, prior to film formation of a buffer layer.

FIG. 6 is a drawing showing a fabricating method including carrying out changeover of carrier gas prior to the film formation of the buffer layer. In a period of time Between times s0 and s1, the substrate temperature of the gallium oxide substrate 11 increases. During a duration of times s1-s2-s3, the substrate temperature is set at a pretreatment temperature $T_{PRE1}$ (e.g., 800 Celsius degrees). During a duration of times s2-s3, the primary surface 11a of the gallium oxide substrate 11 is nitrided at the pretreatment temperature $T_{PRE1}$ (e.g., 800° C.). After completion of the nitridation at the time s3, the substrate temperature is decreased from 800 Celsius degrees to 400 Celsius degrees (e.g., a film formation temperature of an AlN buffer layer) in a duration of times s3-s4. The carrier gas is changed from a nitrogen carrier gas to a hydrogen carrier gas. Prior to a start of growth of the AlN buffer layer, the carrier gas is changed over to the hydrogen carrier gas. With supply of the hydrogen gas, the substrate temperature is changed to 400 Celsius degrees and during a duration of times s4-s5, hydrogen, ammonia, and TMA are supplied into the growth reactor to grow the AlN buffer layer at 400 Celsius degrees. During a duration of times s5-s6, the substrate temperature is increased to a growth temperature of a GaN layer. At a time s7, supply of TMG is started to grow the GaN layer. Since in this sequence the growth of the AlN buffer layer is carried out in the hydrogen atmosphere, the film formation temperature cannot be set high.

Example 1

Several gallium oxide substrates are prepared. These gallium oxide substrates have a primary surface consisting of a (100) plane. A low-temperature AlN buffer layer is grown in various thicknesses on the gallium oxide substrates by MOVPE method. $NH_3$, TMA, and $SiH_4$ are supplied into the growth reactor to grow the low-temperature AlN buffer layer. After this, at the substrate temperature of 1050° C., $NH_3$, TMG, TMA, and $SiH_4$ are supplied onto the low-temperature AlN buffer layer in the growth reactor to grow a high-temperature GaN epitaxial film in the thickness of 3 μm. The GaN epitaxial film is measured by the X-ray diffraction method. The (0001) plane of GaN appears in the surface of the GaN epitaxial film.

The low-temperature AlN films on the gallium oxide substrates are 0.5 nm, 1 nm, 2 nm, 3 nm, 5 nm, 10 nm, 15 nm, 20 nm, 50 nm, 100 nm, and 200 nm. FIG. 7 shows surfaces (delamination, flatness) and crystal qualities (full widths at half maximum of XRD) of high-temperature GaN epitaxial films of the thickness of 3 μm grown on these AlN films. In FIG. 7, a unit of thickness for a AlN film is nanometer. On the low-temperature AlN film 0.5 nm thick, the high-temperature GaN epitaxial film underwent delamination throughout the entire area. On each of the low-temperature AlN films 2 nm to 100 nm thick, the high-temperature GaN epitaxial film demonstrates no delamination and the GaN surface is flat. In the thickness range of these AlN films, the high-temperature GaN epitaxial film shows the quality fairly equivalent to that of an n-type GaN film on a sapphire substrate, as to both of crystallinity and surface flatness. When a device having a LED structure such as an epitaxial lamination is fabricated, the LED structure on the gallium oxide substrate demonstrates much the same emission property as the LED structure on the sapphire substrate. A surface morphology of the GaN epitaxial film exhibited excellent flatness. The low-temperature AlN film 150 nm thick has a rough surface.

Figure 8:
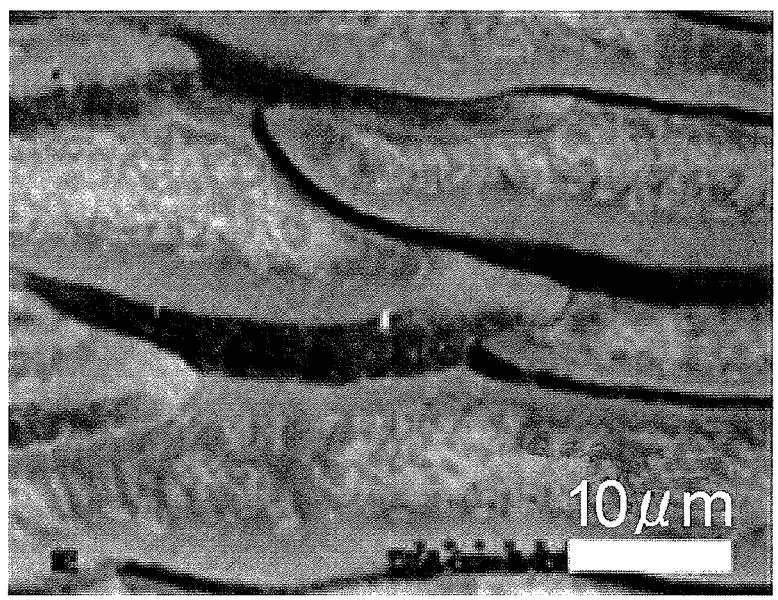
FIG. 8 is a drawing showing appearance of a high-temperature GaN epitaxial film grown through a low-temperature GaN buffer layer on a gallium oxide substrate.

If a low-temperature GaN film is directly grown on the gallium oxide substrate without growth of the low-temperature AlN film, the high-temperature GaN epitaxial film will have the appearance as shown in FIG. 8. The scale bar in FIG. 8 represents 10 μm. As shown therein, when the low-temperature GaN film us used, the high-temperature GaN epitaxial film fails to exhibit flatness.

Example 2

Several gallium oxide substrates are prepared. These gallium oxide substrates have a primary surface of a (100) plane. By the MOVPE process, $NH_3$, TMG, TMA, and $SiH_4$ are supplied into the growth reactor to grow a low-temperature AlN buffer layer on the gallium oxide substrates at various temperatures. The low-temperature AlN buffer layer is 10 nm. After forming low-temperature AlN buffer layer, at the substrate temperature of 1150 Celsius degrees, a high-temperature GaN epitaxial film is grown in the thickness of 3 μm on the low-temperature AlN buffer layer. The GaN epitaxial film is measured by the X-ray diffraction method. The surface morphology of the GaN epitaxial film exhibits excellent flatness.

The film formation temperatures of the low-temperature AlN films on the gallium oxide substrates are as follows: 350 Celsius degrees; 400 Celsius degrees; 450 Celsius degrees; 500 Celsius degrees; 550 Celsius degrees; 600 Celsius degrees; 650 Celsius degrees; 700 Celsius degrees; 800 Celsius degrees; and 850 Celsius degrees. FIG. 9 shows surfaces (delamination, flatness) and crystal qualities (full widths at half maximum of XRD) of high-temperature GaN epitaxial films in the thickness of 3 μm grown on these AlN films. In FIG. 9 a unit of temperature for growth is Celsius degrees. On the low-temperature AlN film at the film formation temperature of 350 Celsius degrees, the high-temperature GaN epitaxial film underwent delamination throughout the entire surface. On each of the low-temperature AlN films at the film formation temperatures of 400 Celsius degrees to 850 Celsius degrees, the high-temperature GaN epitaxial film shows no delamination and the GaN surface is flat. In the temperature range of these AlN film thicknesses, the high-temperature GaN epitaxial film shows the quality fairly equivalent to that of an n-type GaN film on a sapphire substrate, as to both of crystallinity and surface flatness. When a device of a LED structure such as an epitaxial lamination is fabricated, the LED structure on the gallium oxide substrate shows much the same emission property as the LED structure on the sapphire substrate. The (0001) plane of GaN appeared in the surface of the GaN epitaxial film. On the low-temperature AlN film at the film formation temperature of 850 Celsius degrees, the high-temperature GaN epitaxial film has a rough surface.

In Example 1 and Example 2, the low-temperature AlN film is used as a buffer layer. However, it is also possible to use low-temperature AlGaN as a buffer layer, according to Inventors' experiment. Low-temperature AlGaN shows the same effect as the low-temperature AlN film. When the low-temperature AlGaN film is used, it becomes easier to obtain a flat epitaxial layer (e.g., a c-plane GaN surface), with increase of Al mole fraction.

The below will describe a method for fabricating an electronic device, and an epitaxial wafer for it. The epitaxial wafer according to the present embodiment can provide a gallium nitride based semiconductor laminate structure for Schottky diodes, pn junction diodes, transistors, etc., as well as that for light emitting devices such as LED.

When a semiconductor device is a Schottky diode, in step S112 shown in FIG. 1, plural electrodes are form on the epitaxial wafer $E_{SH}$. With reference to FIG. 10 (a), in step S113, a first electrode 31a is formed on the primary surface 15a of the epitaxial layer of the epitaxial wafer $E_{SH}$. The first electrode 31a is, for example, a Schottky electrode and the Schottky electrode can comprise, for example, Au or the like. The first electrode 31a makes a Schottky junction 33a with the epitaxial layer. In step S114, a second electrode 31b is formed on the back surface 11b of the conductive gallium oxide substrate in the epitaxial wafer $E_{SH}$. The second electrode 31b can be, for example, an ohmic electrode. Steps S101 to S114 result in fabricating a gallium nitride based semiconductor device and a substrate product $P_{SH}$ shown in FIG. 10 (a). This gallium nitride based semiconductor device includes a Schottky junction diode.

When the semiconductor device includes a pn junction diode, with reference to FIG. 10 (b), another epitaxial film 35 is grown on the epitaxial film 15 by the MOVPE process. The epitaxial film 15 is undoped or n-type conductive, and can be comprised of a gallium nitride based semiconductor such as n-type GaN or n-type AlGaN. The conductivity of the epitaxial film 35 is opposite to that of the epitaxial film 15. The epitaxial film 35 comprises a gallium nitride based semiconductor, e.g., p-type GaN, p-type AlGaN, or the like. The epitaxial film 35 makes a pn junction 33b with the epitaxial layer 15.

In step S112 shown in FIG. 1, plural electrodes are formed on the epitaxial wafer $E_{PN}$. With reference to FIG. 10 (b), in step S113, a first electrode 31c is formed on an epitaxial layer primary surface 23a of the epitaxial wafer $E_{PN}$. The first electrode 31c can be, for example, a p-ohmic electrode. In step S114, the second electrode 31b is formed on the back surface 11b of the conductive gallium oxide substrate of the epitaxial wafer $E_{PN}$. Steps S101 to S114 result in fabricating a gallium nitride based semiconductor device and a substrate product $P_{PN}$ shown in FIG. 10 (b). This gallium nitride based semiconductor device includes a pn junction diode.

The above described the vertical semiconductor devices such as the Schottky junction diode and the pn junction diode, but the vertical semiconductor devices do not always have to be limited to these; they can be three-terminal devices such as a vertical field effect transistor which can be used as a power device.

When a carrier concentration of the gallium nitride based semiconductor layer 15 is not more than $3\times10^{16}$ cm$^{-3}$, a pn junction diode and a Schottky diode applicable as power devices can be fabricated on the gallium oxide substrate.

Since the buffer layer 13 comprises $Al_XGa_{1-X}N$, the thickness of the buffer layer 13 can be not more than 100 nm.

Having illustrated and described the principle of the present invention in the preferred embodiments, and it is recognized by those skilled in the art that the present invention can be modified in arrangement and details without departing from the principle. The present invention is by no means limited to the specific configurations disclosed in the embodiments. Therefore, we claim all modifications and changes falling within the scope of claims and resulting from the scope of spirit thereof.

LIST OF REFERENCE SIGNS

10 ... growth reactor;
11 ... gallium oxide wafer;
11a ... wafer primary surface;
11b ... wafer back surface;
13 ... buffer layer;
$T_{G1}$, $T_{G2}$ ... film formation temperatures;
15 ... epitaxial layer;
19 ... second conductivity type epitaxial layer;
17 ... active layer;
21 ... p-type electron block layer;
23 ... p-type contact layer;
$E_{LED}$ ... epitaxial wafer;
25 ... semiconductor lamination;
27a, 27b ... electrodes;
$P_{LED}$ ... substrate product;
$E_{SHD}$ ... epitaxial wafer;
31a, 31b ... electrodes;
33a ... Schottky junction;
33b ... pn junction;
35 ... epitaxial film;
$E_{PN}$ ... epitaxial wafer.

The invention claimed is:

1. A method for forming an epitaxial wafer, comprising the steps of:
    placing a gallium oxide substrate in a growth reactor;
    changing a substrate temperature of the gallium oxide substrate, while supplying nitrogen into the growth reactor so as to expose the gallium oxide substrate to a nitrogen atmosphere;
    after the substrate temperature reaches a first film formation temperature, forming a buffer layer of $Al_XGa_{1-X}N$ (0<x≤1) at the first film formation temperature, while supplying nitrogen into the growth reactor; and
    growing a gallium nitride based semiconductor epitaxial layer on the buffer layer at a second film formation temperature in the growth reactor,
    the first film formation temperature being not less than 550 Celsius degrees, and
    supply of hydrogen into the growth reactor being started during growth of the buffer layer,
    wherein a thickness of the buffer layer is not less than 2 nm,
    wherein a maximum temperature in the step of changing a substrate temperature of the gallium oxide substrate is not less than 550 Celsius degrees and not more than the first film formation temperature, and
    wherein the step of changing a substrate temperature of the gallium oxide substrate includes the steps of:
    changing the substrate temperature to a pretreatment temperature of not more than the first film formation temperature and not less than 550 Celsius degrees, in a nitrogen atmosphere; and
    after the substrate temperature reaches the pretreatment temperature, placing the gallium oxide substrate in the nitrogen atmosphere for a predetermined duration, while maintaining the substrate temperature.

2. The method according to claim 1, wherein the supply of nitrogen into the growth reactor is terminated during film growth of the buffer layer.

3. The method according to claim 1, wherein a nitrogen raw material for growth of the buffer layer contains $NH_3$, and a Group III raw material for growth of the buffer layer contains a metal-organic compound.

4. The method according to claim 1, wherein a thickness of the buffer layer is not more than 100 nm.

5. The method according to claim 1, wherein the pretreatment temperature is less than 850 Celsius degrees.

6. The method according to claim 1, wherein a primary surface of the gallium oxide substrate is a (100) plane.

7. The method according to claim 1, wherein the buffer layer comprises $Al_XGa_{1-X}N$ (0.5≤X≤1).

8. The method according to claim 1, wherein the buffer layer comprises AlN.

* * * * *

UNITED STATES PATENT AND TRADEMARK OFFICE
CERTIFICATE OF CORRECTION

PATENT NO. : 8,679,955 B2  Page 1 of 1
APPLICATION NO. : 13/202419
DATED : March 25, 2014
INVENTOR(S) : Hashimoto et al.

It is certified that error appears in the above-identified patent and that said Letters Patent is hereby corrected as shown below:

In the claims:

In claim 7, at column 14, in line 49, "$(0.5 \leq X \leq 1)$" should be --$(0.5 \leq X < 1)$--.

Signed and Sealed this
Twenty-ninth Day of July, 2014

Michelle K. Lee
*Deputy Director of the United States Patent and Trademark Office*